(12) United States Patent
Au et al.

(10) Patent No.: US 8,734,657 B2
(45) Date of Patent: May 27, 2014

(54) LIQUID BARRIER AND METHOD FOR MAKING A LIQUID BARRIER

(75) Inventors: Ching Au, Port Washington, NY (US); Krithika Kalyanasundaram, Hauppauge, NY (US)

(73) Assignee: R.S.M. Electron Power, Inc., Deer Park, NY (US)

( * ) Notice: Subject to any disclaimer, the term of this patent is extended or adjusted under 35 U.S.C. 154(b) by 959 days.

(21) Appl. No.: 12/708,834

(22) Filed: Feb. 19, 2010

(65) Prior Publication Data

US 2011/0206912 A1    Aug. 25, 2011

(51) Int. Cl.
*H01B 13/00*    (2006.01)

(52) U.S. Cl.
USPC ................ 216/13; 216/18; 257/772; 257/779

(58) Field of Classification Search
USPC ............................... 257/772, 779; 216/13, 18
See application file for complete search history.

(56) References Cited

U.S. PATENT DOCUMENTS

| | | | |
|---|---|---|---|
| 5,105,260 A | 4/1992 | Butera | |
| 6,325,644 B1 | 12/2001 | Lemke et al. | |
| 7,377,795 B2 | 5/2008 | Vicich et al. | |
| 2005/0158665 A1* | 7/2005 | Maekawa et al. | 430/313 |
| 2005/0244995 A1* | 11/2005 | Fukuchi et al. | 438/30 |
| 2006/0024504 A1* | 2/2006 | Nelson et al. | 428/409 |

OTHER PUBLICATIONS

Encyclopedia Britannica, Transitive law, http://www.britannica.com/EBchecked/topic/602836/transitive-law ; 1 page; 2013.*

* cited by examiner

*Primary Examiner* — Binh X Tran

(74) *Attorney, Agent, or Firm* — Fitzpatrick, Cella, Harper & Scinto

(57) ABSTRACT

A method for making a liquid barrier includes forming a liquid barrier layer on a substrate, forming a mask layer on the liquid barrier layer such that part of the liquid barrier remains exposed, forming a contact layer on the exposed liquid barrier layer, and removing the mask layer to expose the part of the liquid barrier layer which was covered by the mask layer. A liquid wetting boundary is formed when the wettability on the liquid barrier surface area is less than the wettability of the contact surface area.

10 Claims, 6 Drawing Sheets

LIQUID BARRIER AND METHOD FOR MAKING A LIQUID BARRIER

BACKGROUND OF THE INVENTION

1. Field of the Invention

Example aspects of the invention relate generally to the manufacturing of electronics products, and, more specifically, to the processing of electronics components where liquid flow control and containment is required.

2. Description of the Related Art

Packaging for power electronics can require the use of metallized substrates that provide electrical isolation between components yet maintain high electrical and thermal conductivity. Such components, which include diodes, metal oxide semiconductor field-effect transistors (MOSFETs), insulated-gate bipolar transistors (IGBTs), resistors, and capacitors, are typically attached to substrates using solder alloys. During the attachment process, however, the flow of solder must be controlled to achieve the necessary electrical isolation between components and to maintain the proper orientation and alignment of the components. A known practice is to apply a polymer onto a substrate for stopping and controlling solder flow. Industry standard polymers include epoxies and polyimides; particular polymers include Taiyo PSR 4000, Taiyo PSR AUS5, Hitachi HP 300, and Epotek TV1002.

Known solder barrier materials, however, suffer drawbacks. While application of these materials often is straightforward, material degradation can subsequently occur. Polymers such as epoxy have a low glass transition temperature—typically around 125° C.—beyond which the material can soften and electrically degrade. On the other hand, polyimide exhibits inherently poor adhesion to most metallized surfaces. Its adhesion reduces further at high temperatures or when subjected to multiple temperature cycles, as may occur during manufacturing and application. Accordingly, epoxy— and polyimide—based polymers are susceptible to delamination and/or scaling. Traditionally, solder reflow occurred at a furnace peak temperature of 230° C. Recently, however, the European Union's Restriction of Hazardous Substances (RoHS) Directive has forced the global electronic packaging industry to switch to the use of lead-free solder alloys. These alloys typically reflow at furnace peak temperatures of at least 250° C.; some reflow as high as 320° C. These more-demanding solder reflow environments can lead to or exacerbate delamination and scaling of polymer materials, diminishing their effectiveness as solder stops during reflow.

Polymer solder barrier materials can further degrade after solder reflow when used in high temperature environments. High-temperature storage and operating conditions are commonly stipulated as design requirements for state-of-the-art power electronics. While traditional power electronics are designed to operate at a maximum of 85° C., next-generation devices are required to operate at temperatures up to 250° C. Degradation, delamination and scaling of solder stop materials in a manufactured device can result in loose particles within the package. In accordance with military and other high-reliability standards, such as Military Performance Specification 19500 (MIL-PRF-19500), these particles are considered foreign object debris (FOD), which can compromise the long-term reliability of a device.

A further drawback of using a polymer material as a solder stop is that it increases the cost and lead time of a manufactured device. When used as solder stops, polymers are deposited and patterned in separate processing steps, which leads to additional processing time. Use of such polymers also requires additional material handling and expenditure as these special material formulations often are not used in any other device processing steps.

Thus, there is a need for a solder barrier that is physically stable and can be easily integrated into the manufacturing of high-temperature power electronics. This need also arises in other manufacturing processes that involve electronics components. Specific examples of such processes include joint brazing and liquid epoxy attach. Generally speaking, there is a need for a physical liquid barrier that can effectively control the flow and containment of liquids during electronic component processing, yet remain stable when subjected to high temperature processing and application environments.

SUMMARY OF THE INVENTION

The present invention addresses the challenges and limitations discussed above.

One aspect of the invention is that it provides a liquid barrier compatible with manufacturing processes associated with power electronics components and substrates. Another aspect of the invention is that a liquid barrier can withstand repeated thermal stress during typical device packaging processes as well as during high-temperature operation and storage of a packaged device. Yet another aspect of the invention is that a liquid barrier, when formed on a substrate and used during the manufacturing process of a device, provides a contact angle differential between areas in which liquid flow is desired and areas in which it is not.

In various embodiments of the invention, liquid barriers are formed from materials plated or otherwise deposited onto the surface of a substrate. In some embodiments, liquid barriers can be formed by selectively plating or depositing material layers onto a substrate such that some areas of the substrate possess high contact angles with respect to a liquid, and thus do not readily wet the liquid, while other areas possess low contact angles and are susceptible to flow of the liquid. Selective plating can be accomplished, for example, by incorporating mask layers into a plating process. In other embodiments, liquid barriers can be formed by plating or depositing multiple layers onto a substrate and then selectively removing one or more layers to expose high or low contact angle surfaces. For example, two layers may be plated onto a substrate, the first layer being dewetting to a liquid while the second layer being amenable to liquid flow. By removing the second layer from certain regions of the substrate, those regions can act as liquid barriers. In still other embodiments, a liquid barrier can be enhanced by selectively modifying or creating a surface layer, for example, by laser ablation or chemical etching.

Further aspects of the present invention, as well as the structure and operation of various example embodiments, are described in detail below with reference to the accompanying drawings.

BRIEF DESCRIPTION OF THE DRAWINGS

Features and advantages of the embodiments described below will become more apparent when taken in conjunction with the drawings.

DETAILED DESCRIPTION OF EXAMPLE EMBODIMENTS

Figure 1:
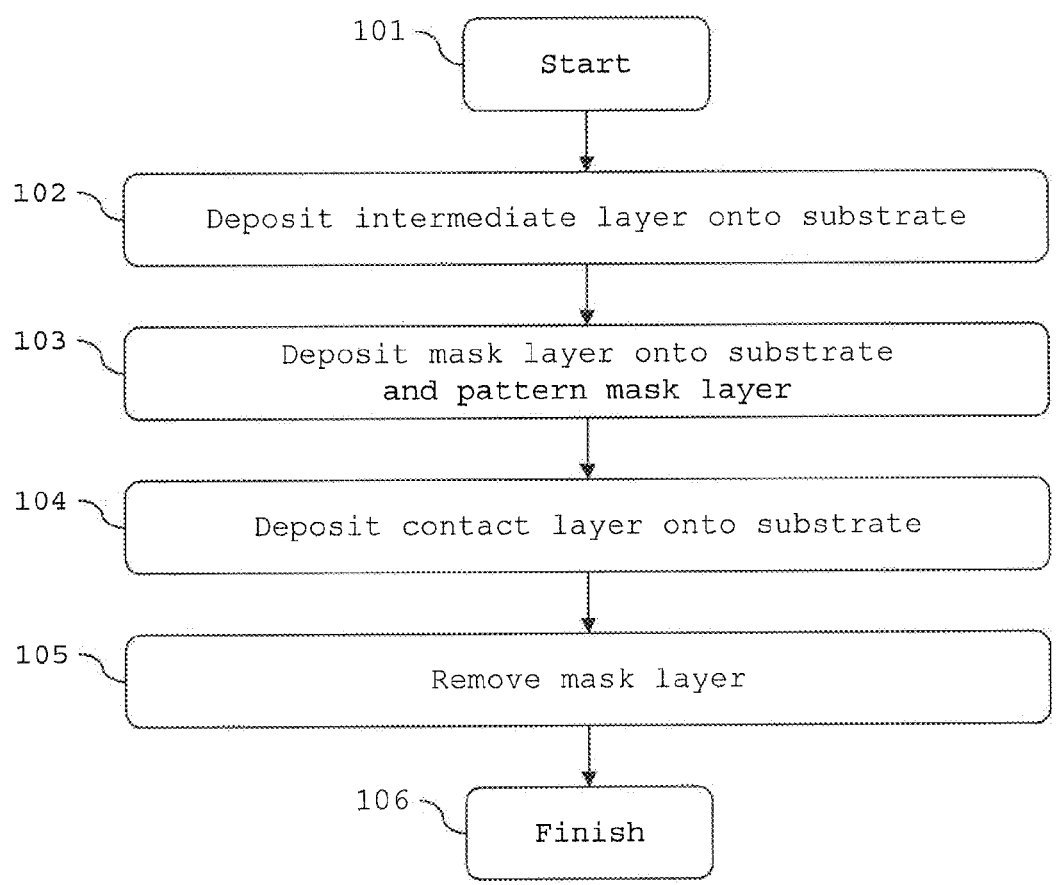
FIG. 1 is a process flow according to one embodiment of the invention.

As noted above, one aspect of the invention is that a liquid barrier can be formed by creating a contact angle differential between surfaces in which liquid flow is desired and areas in which it is not. In other words, a boundary between areas of sufficiently different wettabilities can provide a barrier to the flow of a liquid. A highly wetting area, i.e., one with a low contact angle, is an area where liquid flow is intended or desired; a bordering area with low wettability, i.e., an area with a high contact angle, is one where liquid flow is prevented. The boundary between these areas is thus a liquid barrier because it can impede the flow of a liquid from the low contact angle area on to the high contact angle area, hence controlling and confining the liquid to stay within the low contact angle area.

The extent to which a liquid wets or spreads on a surface depends upon the interfacial energies between the liquid, the surface, and the ambient. At steady state, thermodynamic equilibrium between the three phases must be attained. Specifically, the contact angle θ can be calculated by the triple point equation:

$$\cos\theta = \frac{\gamma_S - \gamma_{SL}}{\gamma_L},$$

where $\gamma_S$ is the solid-ambient interfacial energy, $\gamma_L$ the liquid-ambient interfacial energy, and $\gamma_{SL}$ the solid-liquid interfacial energy. In general, small contact angles, namely, angles from 0° to 40°, will give rise to good wetting of a liquid on a surface, while contact angles of 90° and above will result in poor wetting. In some embodiments of the invention, a contact angle differential of at least 60° between adjacent areas is necessary to result in a liquid barrier. Other embodiments of the invention, however, are not limited to any particular contact angle differential of any adjacent surfaces. In practice, whether the contact angle differential is sufficient to give rise to a liquid barrier is highly dependent on the material combinations and the environment that these materials are being subjected to. Accordingly, the invention is applicable to any liquid barrier formed at the boundary of surfaces having different contact angles, i.e., wettability differential.

In one embodiment of the invention, a liquid barrier may be formed by formation of a layer having a high contact angle with respect to a liquid, followed by selective formation of a layer having a low contact angle with respect to the same liquid. Examples of this embodiment are described below in connection with FIGS. 1, 2A-E, and 3. In another embodiment of the invention, a liquid barrier may be formed by selective removal of the low contact angle layer, exposing the underlying high contact angle layer to create a liquid barrier. Examples of this embodiment are described below in connection with FIGS. 4 and 5. In yet another embodiment of the invention, a liquid barrier may be formed by locally altering a surface to impede its ability to form intermediate compounds that may promote wetting and adhesion of the liquid. In this embodiment, alteration may be performed by, for example, laser etching, sandblasting, or chemical etching.

Some example embodiments of the invention are directed to barriers that impede the flow of particular liquids such as molten solder or brazing alloys. In these examples, wettability of the liquid alloy and the subsequent adhesion of the alloy upon cooling may depend not only on the contact angle between the liquid and the layer on which the liquid flows, but also on the formation of intermetallic compounds between the alloy and the layer. Some surfaces can prevent the formation of such intermetallics, thus further limiting surface wetting by acting as a solder diffusion barrier. One example is a native metallic oxide layer that forms on the surface of a metal layer. A native oxide layer thus can limit wettability of molten solder or a brazing alloy in two ways: (1) by providing a high contact angle when in contact with molten solder; and (2) by limiting diffusion of the underlying metal to the solder layer due to the difficulty of intermetallic compound formation. For example, an oxide layer that provides a contact angle in the range of 90° to 125° with respect to a solder can be a suitable dewetting surface. This oxide layer further limits the wettability by preventing the formation of intermetallic compounds between the solder and the base metal.

In various example embodiments of the invention, a native nickel oxide surface on a base nickel layer can be such an oxide layer. Thus, the nickel oxide surface can be a dewetting area; when it is located adjacent to a wetting area, the border between the two areas gives rise to a liquid barrier—in particular examples, a barrier to molten solder or braze during reflow. Using a nickel oxide layer as a liquid barrier offers several advantages. Nickel oxide is a tenacious oxide that forms readily on the nickel base layer. Due to its excellent adhesion, plated or deposited nickel is used regularly in power electronics packaging processes to protect other base metals, such as copper or Kovar, from serious oxidation. Unlike polymer-based solder barriers, nickel oxide does not significantly degrade at high temperatures or even in chemically-reducing environments. Advantages of nickel and its oxide aside, example embodiments in which a nickel layer is used are clearly not limited to solder barriers having a dewetting layer that is comprised only of nickel oxide on a nickel layer. Those having skill in the art will recognize that other metals or materials may be substituted for nickel and its oxide, as well as any of the other materials discussed below. Those having skill in the art will also recognize that a liquid barrier in the present invention is a barrier that arises from a contact angle differential. The materials involved in the formation of such liquid barrier are not limited to only molten solder and nickel oxide, but may include any combination of metals or polymers or any other classes of materials as long as such contact angle differential is achieved.

Figure 2A:
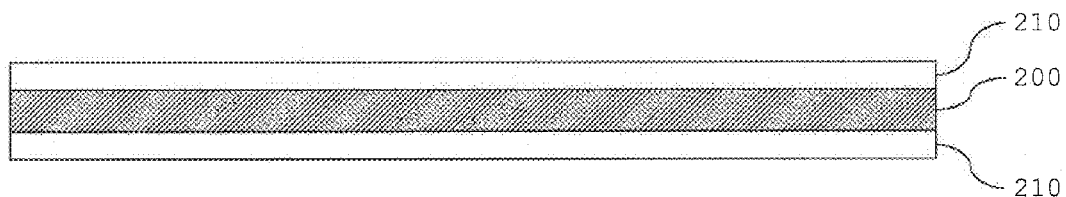
FIGS. 2A-E illustrate an example embodiment of the invention after various steps of the process shown in FIG. 1.

An example process flow for forming a liquid barrier is shown in FIG. 1. This process can provide a substrate with regions having a low contact angle with respect to a liquid, where liquid flow is desired, bordered or bounded by a liquid barrier comprising regions having a high contact angle. Features of this process will be described in connection with FIGS. 2A-E, which illustrate an example substrate after various steps of the process of FIG. 1. The process begins at step 101 by providing a substrate such as a metallized ceramic substrate, an insulated metal substrate, or a FR4 substrate. A metallized ceramic substrate is a piece of ceramic base material on which one or more metallized layers are formed. Example ceramic base materials include $Al_2O_3$, AlN, $Si_3N_4$, and SiC. The metallized layer can be formed through various metallization techniques such as thick-film metallization, thin-film metallization, direct eutectic bonding, and active metal brazing. Materials comprising the metallized layer can include copper, nickel, gold, palladium, platinum, and tungsten. A cross-section of an example substrate is illustrated in FIG. 2A, which includes ceramic base 200 and metallized layer 210, formed on both the top and the bottom sides of the base. While this example is described in the context of a metallized ceramic substrates, the invention is not limited to such substrates. In practice, the embodiments may include or incorporate other substrates such as FR4 substrates, insulated metal substrates, engineered plastic substrates, matrix composite substrates, or substrates with or without metallization that those having skill in the art will recognize as suitable for use with any embodiment.

Figure 2B:
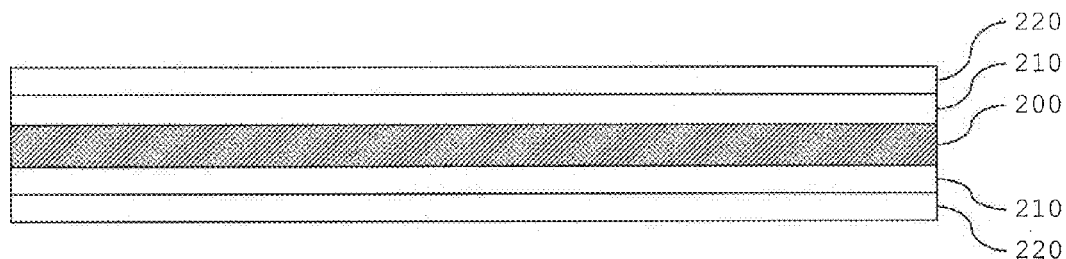

At step 102, a protective base, or intermediate, layer is deposited or plated onto the metallized ceramic substrate. According to an aspect of the invention, the base layer provides, or can be modified to provide, a high contact angle with respect to a liquid on its surface. Materials for the base layer can include any form of nickel, such as pure nickel and nickel alloys, or any other suitable metal or non-metal layer. The base layer can be deposited, for example, by electroplating or electroless plating. While the base layer may be deposited to any suitable thickness, in some embodiments it is plated to a thickness of 100 μin to 300 μin. A cross-section view of a metallized ceramic substrate after step 102 is illustrated in FIG. 2B, which shows the formation of protective base layer 220 formed on the metallization layer 210 on the top and bottom sides of the substrate.

Figure 2C:
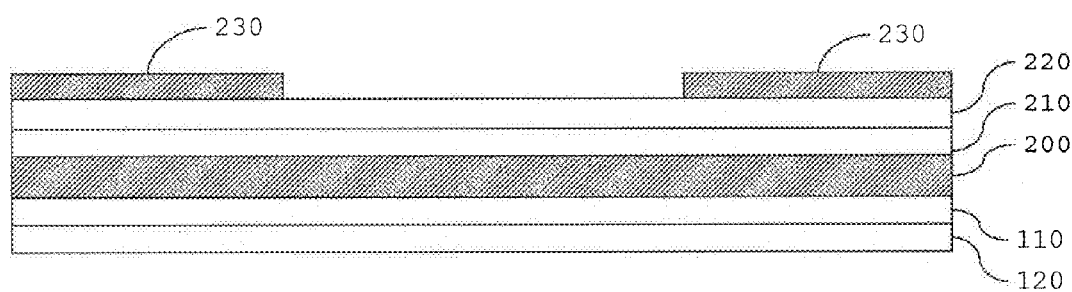

A mask layer is deposited on the substrate and patterned at step 103. The mask layer can be any temporary material that can be patterned and deposited on the substrate and removed at the end of the substrate manufacturing process; one example of a mask layer is a photosensitive material patterned by a photolithographic process. For example, a UV-sensitive photoresist or a dry film photoresist may be used. These photoresists may be positive or negative resists. If a dry film photoresist is used, it may be deposited onto the substrate by a lamination process. Once deposited onto the substrate, a pattern can be formed in the photosensitive material by exposing the material using a photomask and developing it to reveal regions of underlying metallization and/or substrate. A cross-section of a metallized ceramic substrate after step 103 is illustrated in FIG. 2C. This figure shows regions of the protective base layer 220 being masked by mask layer 230.

Figure 2D:
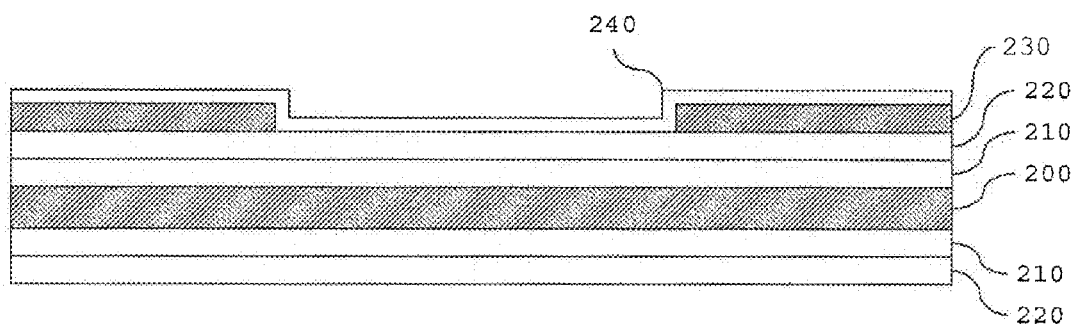

At step 104 a contact layer is deposited on the substrate. The contact layer is deposited onto regions of the protective base layer left exposed by the mask following step 103. According to an aspect of the invention, the contact layer provides, or can be modified to provide, a low contact angle with respect to a liquid on its surface. The mask applied in step 103 prevents the contact layer, which is comprised of one or more materials on which liquid flow is desired, from being deposited on areas where liquid flow is not desired. As an example, the contact layer can be an area where solder flow is desired during device packaging on the substrate. The contact layer can be deposited, for example, by electroplating or electroless plating. The contact layer may be deposited to any suitable thickness. In an example embodiment, the contact layer is a gold layer flash plated to a thickness of up to 20 μin. A cross-section of a substrate after step 104 is illustrated in FIG. 2D, which shows contact layer 240 formed by electroplating the top side of the substrate. This figure illustrates how the mask layer 230 protects areas of the protective base layer 220 from being plated by the contact layer 240.

Figure 2E:
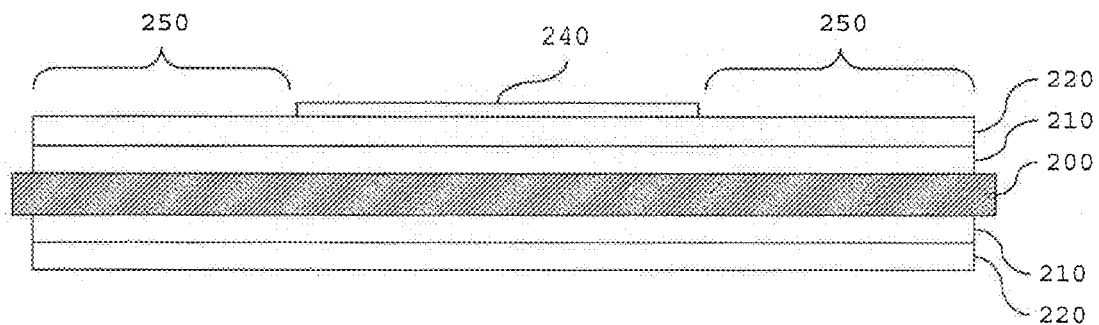

At step 105, the mask layer is removed from the substrate. Removal of the mask layer exposes areas of the base layer 220 that were masked during the deposition of the contact layer. A cross-section of a substrate after step 105 is illustrated in FIG. 2E. This figure shows areas where the contact layer 240 was deposited onto the base layer 220. It also shows regions 250 where the base layer 220 was masked during deposition of the contact layer 240 and subsequently exposed during step 105. At step 106, the process is complete.

By virtue of the process shown in FIG. 1, a liquid barrier is formed at boundaries between the exposed regions 250 of the base layer 220 and the contact layer 240. This liquid barrier arises due to the relatively small contact angle of a liquid when on the surface of the contact layer, as compared to the relatively high contact angle of the liquid when on the surface of the base layer. In other words, when a liquid is applied to the contact layer 240, it can wet the surface of the contact layer; but if it reaches a boundary with the region 250, it can be prevented from wetting onto the exposed base layer 220 due to the higher contact angle the liquid has with the surface of that layer. The relative difference between wetting on the base layer and wetting on the contact layer thus is what causes the boundary to serve as a liquid barrier. This may be more fully understood by considering an example manufacturing process during which components are attached to the substrate. Part of this process can include placing solder at various areas of the contact layer. During solder reflow, it may be desired that solder only flow within those areas; flow of solder onto the base layer or across the intended isolation distance between components on the contact layer may result in a loss of electrical isolation or even solder bridging across the attached components. By providing a base layer that has a high contact angle with respect to molten solder, the flow of solder onto the base layer can be impeded and the intended isolation distance maintained. This dewetting capability is achieved from a sufficient wettability differential between the contact layer and the base layer. Putting it another way, wettability of the base layer is less than wettability of the contact layer.

In an example embodiment, a sufficient surface tension differential is achieved, giving rise to a liquid barrier, by forming a contact layer from gold and a base layer from nickel. Because nickel readily forms a native oxide layer when exposed to air, the surface of the base layer is covered with nickel oxide. Thus, in this example, it is the surface tension differential between the nickel oxide and gold that results in the liquid barrier. A liquid barrier fabricated according to this example embodiment is shown in FIG. 3, which is discussed below.

Those having skill in the art will recognize that the process shown in FIG. 1, as illustrated by FIGS. 2A-E, is simply an example of one embodiment of the invention. This embodiment, however, is not limited to the steps described above. For example, a metallized ceramic substrate can be patterned prior to step 102 in order to electrically isolate regions of the metallized layer from each other. That is, the substrate can be provided with lands or an electrical circuit pattern in the metallized layer. Electrically isolated regions may be formed, for example, by a photochemical etching process. The process can include depositing and patterning a photosensitive material in a manner similar to that described in connection with step 103. With the pattern formed, the underlying metallization can be etched using an appropriate solution, for example, a heated ferric chloride solution or other acidic solution. The remaining photosensitive material, which protects unexposed areas of metallization during the chemical etch, can be removed after etching. As another example of a step not shown in FIG. 1, there can be a masking step prior to step 103 and a mask removal step following step 103 to mask certain areas of the substrate during deposition of the base layer. Thus, the base layer deposited in step 102 may be patterned.

Figure 3:
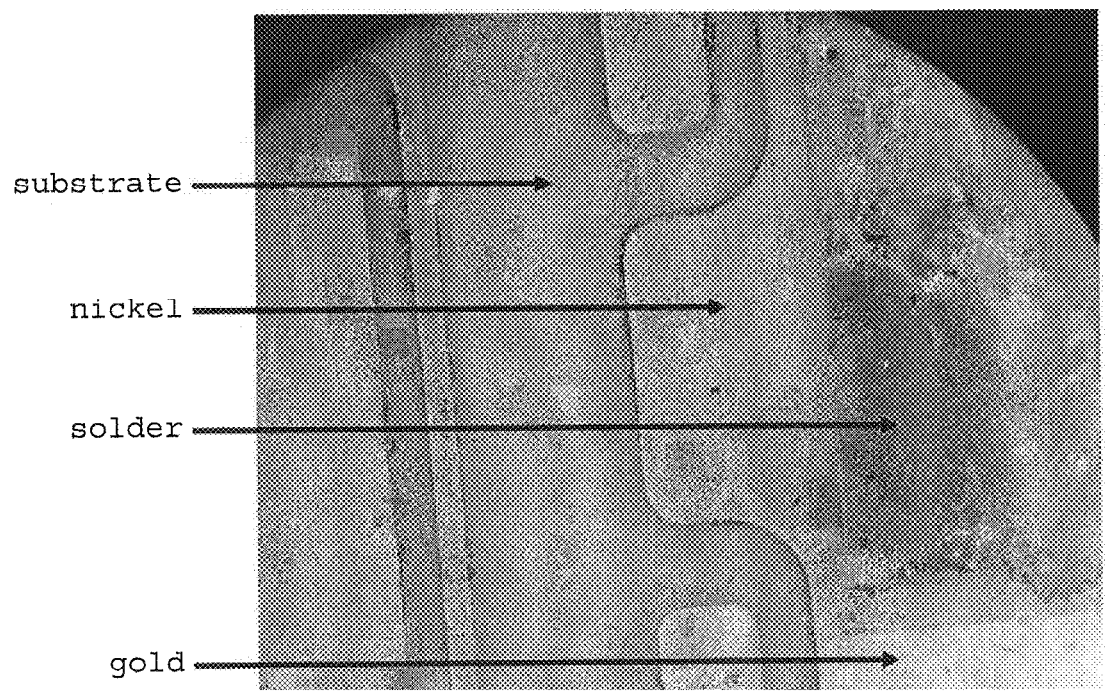
FIG. 3 is a micrograph of a substrate that includes a solder barrier fabricated according to an example embodiment of the invention.

A particular example of liquid barrier fabricated according to the process of FIG. 1 is shown in FIG. 3. This figure is a micrograph of the surface of a metallized ceramic substrate plated with a nickel base layer and a gold contact layer. Solder paste of a tin/lead composition (63% Sn and 37% Pb by weight manufactured by EFD, Inc.) was dispensed onto the top of the substrate metallization, bridging both the nickel base layer and the gold contact layer. The substrate was heated to 230° C. on a hot plate for solder reflow. It was observed that the solder that was dispensed on the gold contact layer stayed in the same region while the solder dispensed on the nickel base layer dewetted, retracted, and merged with the molten solder in the gold contact region. Even with the application of flux (Superior No. 99 RMA Flux manufactured by Superior Flux and Mfg. Co.), which was designed to reduce the amount of oxide for improved wetting, on the nickel base layer after the above phenomenon took place, the nickel base layer was still unable to wet the molten solder and let the solder flow out of the gold contact region. As shown in the micrograph, the solder completely wets and covers the contact layer region. As a result, no gold is visible. On the other hand, the nickel layer surrounding this region does not show any sign of solder due to the high contact angle to solder by virtue of its native oxide surface. Thus, the nickel layer with a native oxide surface acted effectively as a liquid barrier to the molten solder during reflow.

Figure 4:
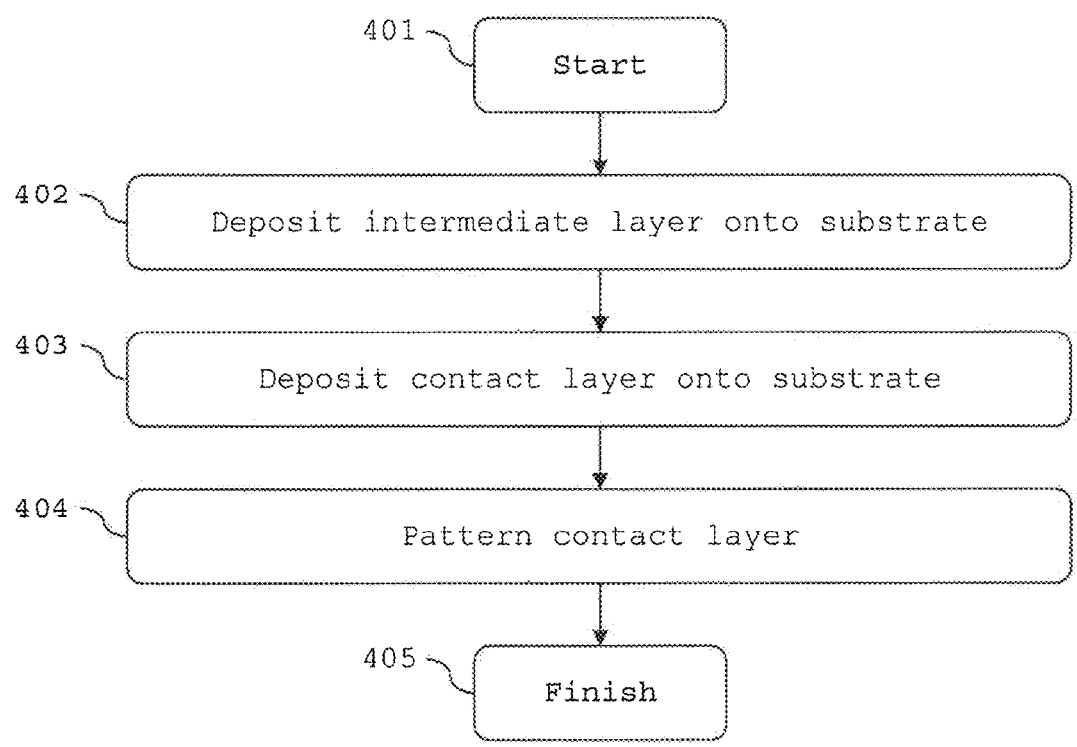
FIG. 4 is a process flow according to another embodiment of the invention.

Turning now to another embodiment of the invention, an alternative process flow for forming a liquid barrier is shown in FIG. 4. This process proceeds according to an embodiment in which a liquid barrier is formed by the selective removal of materials. Similar to the process in FIG. 1, this process begins at step 401 by providing a substrate such as a metallized ceramic substrate. At step 402, a protective base metal, or intermediate layer is, deposited or plated onto the substrate, and then at step 403 a contact layer is deposited or plated onto the base layer.

The contact layer is selectively removed at step 404 to expose the underlying base layer. The contact layer can be selectively removed, for example, by a photochemical etching process similar to that described above for forming lands or an electrical circuit pattern on a metallized substrate. The underlying base layer thus can be exposed in regions that are not masked during etching. As another example, the contact layer can be selectively removed by laser ablation. Laser ablation can function not only to remove the contact layer, but also to enhance the formation of a native oxide layer on top of the base layer once the base layer is exposed to the laser after the contact layer is removed. Selective removal by laser ablation can be accomplished, for example, by known methods for scanning a laser beam and/or masking particular regions of a substrate from a beam. At step 405 the process is complete. Thus, a liquid barrier similar in function to that described above in connection with FIGS. 1 and 2A-E can be formed by a process in accordance with FIG. 4. Those having skill in the art will recognize that the embodiment shown in FIG. 4, like the embodiment shown in FIG. 1, is not limited to the particular steps described.

In an example of this embodiment, a base layer of nickel and a contact layer of gold can be plated onto a metallized ceramic substrate. The gold layer is then ablated to expose the nickel layer and an oxide is formed on the nickel surface. In this example, the gold may be ablated by a Q-switched, 1060-nm semiconductor laser at an average power of 20 W. This technique is simply an example; those having skill in the art will recognize that ablation in this example embodiment can proceed according to any other suitable technique.

Figure 5:
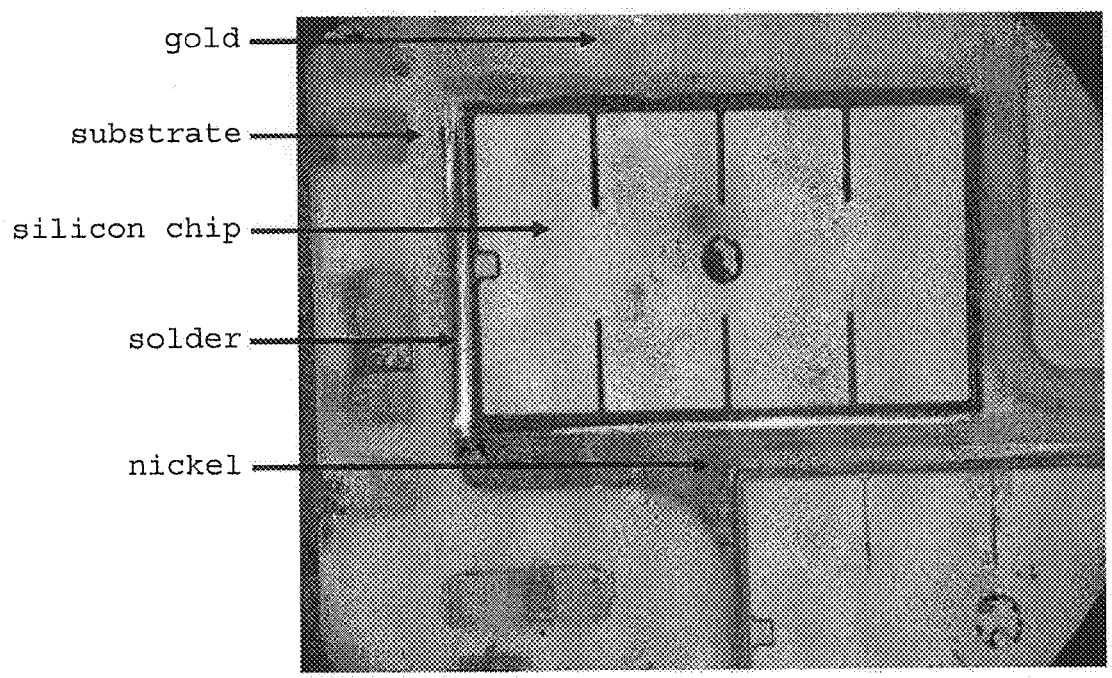
FIG. 5 is a micrograph of a substrate that includes a solder barrier fabricated according to another example embodiment of the invention.

A particular example of liquid barrier fabricated according to the process of FIG. 4 is shown in FIG. 5. This figure is a micrograph of the surface of a metallized ceramic substrate, which also has a nickel base layer and a gold contact layer. In one region of the contact layer, a high temperature solder (92.5% Pb, 5% In, and 2.5% Ag by weight) was placed and reflowed at 350° C. peak temperature in a $H_2$ atmosphere. The solder was used to attach to the substrate a silicon chip, which substantially covers the area of the reflowed solder. As shown in the micrograph, the solder is well under control by the liquid barrier and has not flowed onto the adjacent nickel layer. The reflow in a $H_2$ atmosphere demonstrates that even in a reducing environment, the nickel oxide surface will not be reduced to an extent that it ceases to act as a solder barrier. Furthermore, the reflow at 350° C. demonstrates that the solder barrier can withstand high temperatures associated with state-of-the-art electronics packaging processes. Although not shown in FIG. 5, similar solder barriers were fabricated and their capabilities tested. Positive results were obtained for a lead-tin solder (92.5% Pb, 5% Sn, and 2.5% Ag) and a gold-tin solder (80% Au and 20% Sn), both of which were reflowed in a $H_2$ atmosphere.

Another aspect of the invention is that a liquid barrier, once formed, can be enhanced by surface modification. As discussed above, a native oxide surface forms on nickel when it is exposed to air, and this surface can provide a sufficient surface tension differential to act as a liquid barrier. Yet this oxide can be enhanced by annealing the solder barrier surface. Annealing can further grow the oxide layer, increasing its thickness and improving its efficacy as a liquid barrier. In an example embodiment, a liquid barrier for containing molten solder can be enhanced by annealing the substrate in air at 300° C. for two hours. A native nickel oxide also can be enhanced by selective laser ablation. As noted above, laser ablation can act to form an oxide on the surface of the ablated layer. Thus, a nickel oxide solder barrier, whether formed by a selective deposition or removal process, may be enhanced by further selective laser ablation of the nickel layer.

In the foregoing description, some aspects of the present invention were described with reference to specific embodiments and examples thereof. Despite these specific embodiments, many additional modifications and variations would be apparent to those skilled in the art. Thus, it is to be understood that embodiments of the invention may be practiced in a manner otherwise than as specifically described. Accordingly, the specification is to be regarded in an illustrative fashion rather than a restrictive one. It will be evident that modifications and changes may be made thereto without departing from the broader spirit and scope.

Similarly, it should be understood that the figures are presented solely as examples. The attributes and features of the embodiments presented herein are sufficiently flexible and configurable such that the invention and any of its embodiments can be practiced and navigated in ways other than those shown in the accompanying figures.

Furthermore, the purpose of the foregoing abstract is to enable the U.S. Patent and Trademark Office, the general public, and scientists, engineers, and practitioners in the art who are unfamiliar with patent or legal terms or phrases, to quickly determine from a cursory inspection the nature and essence of the technical disclosure. The abstract is not intended to limit the scope of the present invention in any way. It is also to be understood that the processes recited in the claims need not be performed in the order presented.

What is claimed is:

1. A solder barrier substrate comprising:
an insulating substrate having a metallization layer on a top surface of the insulating substrate;
a base layer on a top surface of the metallization layer;
a patterned contact layer on a portion of a top surface of the base layer, the top surface of the patterned contact layer having a wettability greater than a wettability of the top surface of the base layer; and
a solder barrier defined by a boundary between (i) the patterned contact layer and (ii) a portion of the top surface of the base layer adjacent to the portion of the top surface of the base layer that includes the patterned contact layer,
wherein the base layer comprises a metal and the to surface of the base layer comprises an oxide of the metal, and
wherein the metal comprises nickel and the patterned contact layer comprises gold.

2. A solder barrier substrate according to claim 1, wherein the oxide of the metal is formed by laser ablation.

3. A solder barrier substrate according to claim 1, wherein the oxide of the metal is a native oxide.

4. A solder barrier substrate according to claim 1, wherein the wettability of the top surface of the patterned contact layer is first contact angle with respect to a liquid solder,
wherein the wettability of the top surface of the base layer is defined by a second contact angle with respect to the liquid solder, and
wherein the first contact angle is 0° or more and 40° or less and the second contact angle is 60° or greater.

5. A solder barrier substrate according to claim 4, wherein the liquid solder comprises primarily one of lead and gold by weight.

6. A solder barrier substrate according to claim 1, wherein the insulating substrate is one of an FR4 substrate, insulated metal substrate, an engineered plastic substrate, a matrix composite substrate, and a ceramic substrate.

7. A solder barrier substrate according to claim 6, wherein the insulating substrate is a ceramic substrate that includes at least one of $Al_2O_3$, AlN, BeO, $Si_3N_4$, and SiC.

8. A substrate comprising:
an insulator;
a metallization layer on the insulator; and
a solder barrier on the metallization layer, the solder barrier comprising a boundary between an exposed surface of a base layer and an exposed surface of a contact layer,
wherein the exposed surface of the base layer has a wettability less than a wettability of the exposed surface of the contact layer,
wherein the insulator is one of an FR4 substrate, insulated metal substrate, an engineered plastic substrate, a matrix composite substrate, and a ceramic substrate, and
wherein the contact layer is comprised of gold.

9. A substrate according to claim 8, wherein the base layer is comprised of a metal and the top surface of the base layer is comprised of an oxide of the metal.

10. A substrate according to claim 9, wherein the metal is nickel.

* * * * *